(12) United States Patent
Clingman et al.

(10) Patent No.: US 9,882,115 B2
(45) Date of Patent: Jan. 30, 2018

(54) INTEGRATED COMPLIANT BOUNDARY FOR PIEZOELECTRIC BIMORPH ACTUATOR

(71) Applicant: The Boeing Company, Chicago, IL (US)

(72) Inventors: Dan J. Clingman, Milton, WA (US); Esther S. Zidovetzki, Venice, CA (US)

(73) Assignee: The Boeing Company, Chicago, IL (US)

( * ) Notice: Subject to any disclaimer, the term of this patent is extended or adjusted under 35 U.S.C. 154(b) by 322 days.

(21) Appl. No.: 14/677,138

(22) Filed: Apr. 2, 2015

(65) Prior Publication Data

US 2016/0293828 A1 Oct. 6, 2016

(51) Int. Cl.
*H01L 41/09* (2006.01)
*H01L 41/053* (2006.01)
*H01L 41/16* (2006.01)
*H01L 41/22* (2013.01)
*H01L 41/083* (2006.01)
*B64C 23/00* (2006.01)
*H01L 41/313* (2013.01)
*H01L 41/277* (2013.01)
*H01L 41/047* (2006.01)

(52) U.S. Cl.
CPC .......... *H01L 41/053* (2013.01); *B64C 23/005* (2013.01); *H01L 41/0478* (2013.01); *H01L 41/098* (2013.01); *H01L 41/0973* (2013.01); *H01L 41/277* (2013.01); *H01L 41/313* (2013.01); *B64C 2230/18* (2013.01); *Y02T 50/166* (2013.01)

(58) Field of Classification Search
CPC ............... H01L 41/053; H01L 41/0478; H01L 41/0973; H01L 41/098; H01L 41/277; H01L 41/313; B64C 23/005
USPC ........ 310/324, 328, 354, 355, 365, 330–332
See application file for complete search history.

(56) References Cited

U.S. PATENT DOCUMENTS

| | | | | |
|---|---|---|---|---|
| 2,399,513 A | * | 4/1946 | Shapiro .................. | H04R 17/02 310/322 |
| 3,370,187 A | * | 2/1968 | Straube ................. | B06B 1/0603 310/330 |
| 4,140,936 A | * | 2/1979 | Bullock .............. | H01L 41/0933 310/328 |
| 4,349,762 A | | 9/1982 | Kitamura et al. | |
| 5,634,999 A | * | 6/1997 | Takeuchi .............. | G01L 9/0042 156/89.11 |
| 5,767,612 A | * | 6/1998 | Takeuchi ................ | B41J 2/161 310/324 |

(Continued)

FOREIGN PATENT DOCUMENTS

| | | | | |
|---|---|---|---|---|
| JP | 2000 350964 A | 12/2000 | | |
| JP | 2003169118 A | 6/2003 | | |
| JP | 2003169118 | * | 6/2013 | ............. H04M 1/03 |

*Primary Examiner* — Thomas Dougherty
(74) *Attorney, Agent, or Firm* — Felix L. Fischer

(57) ABSTRACT

A piezoelectric bimorph actuator with an integral compliant boundary employs a first piezoelectric element, a second piezoelectric element and a composite layer intimately engaged between the first and second piezoelectric elements to form a bimorph actuator. The composite layer extends from a peripheral edge of the piezoelectric elements and has a curved interface portion providing a mount for attachment of the bimorph actuator.

19 Claims, 19 Drawing Sheets

(56) References Cited

U.S. PATENT DOCUMENTS

| | | | |
|---|---|---|---|
| 6,674,219 B1* | 1/2004 | Szilagyi | A42B 3/30 |
| | | | 310/328 |
| 7,635,941 B2* | 12/2009 | Bank | H04R 7/045 |
| | | | 310/328 |
| 7,681,290 B2 | 3/2010 | Clingman et al. | |
| 8,247,954 B2* | 8/2012 | Kagayama | B06B 1/0603 |
| | | | 310/324 |
| 8,963,401 B2* | 2/2015 | Smirnov | F04B 43/046 |
| | | | 310/324 |
| 9,013,092 B2* | 4/2015 | Mahapatra | B82Y 15/00 |
| | | | 310/339 |
| 2005/0040736 A1* | 2/2005 | Topliss | H01L 41/098 |
| | | | 310/367 |
| 2009/0096326 A1 | 4/2009 | Onishi | |
| 2010/0219722 A1* | 9/2010 | Onishi | B06B 1/0651 |
| | | | 310/348 |
| 2012/0082326 A1 | 4/2012 | Kano | |
| 2013/0266461 A1* | 10/2013 | Hirata | F04B 17/003 |
| | | | 417/413.2 |

\* cited by examiner

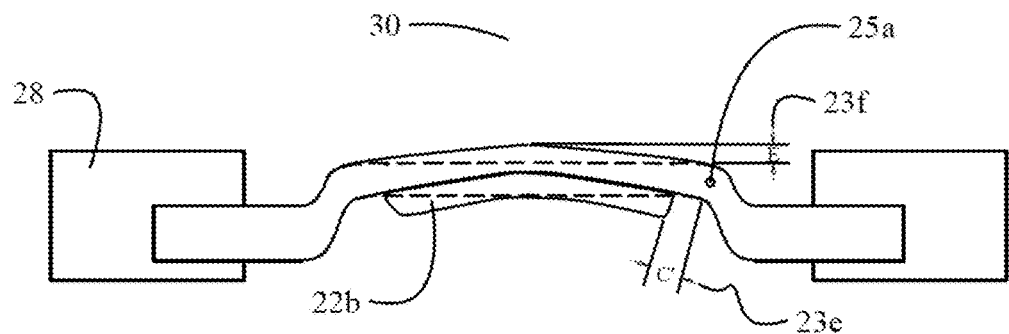
FIG. 9D
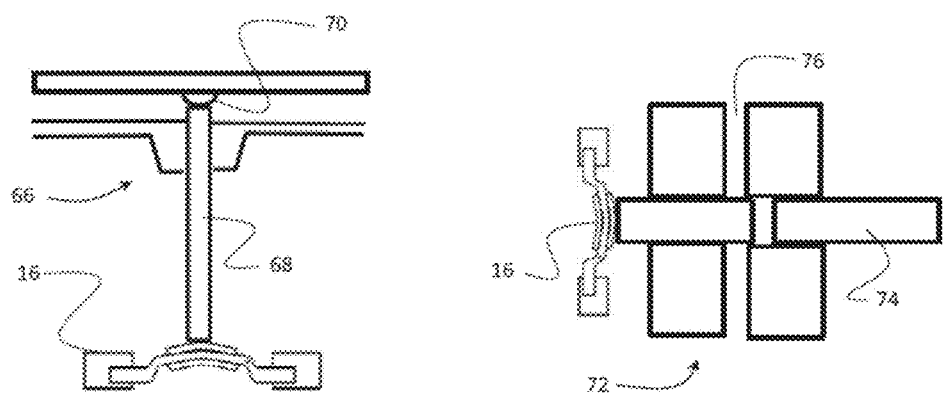
FIG. 11A
FIG. 11B

INTEGRATED COMPLIANT BOUNDARY FOR PIEZOELECTRIC BIMORPH ACTUATOR

BACKGROUND INFORMATION

Field

Embodiments of the disclosure relate generally to piezoelectric actuators and more particularly to a piezoelectric bimorph actuator having a center layer between two piezoelectric disks with the center layer extending from the disks in a curved profile for mounting allowing the bimorph to extend and contract during operation.

Background

Piezo electric bimorph actuators are employed for various applications including synthetic jet generators for active flow control on aerodynamic surfaces. Typically such bimorph actuators are clamped in place using rigid structure. The rigid mounting restricts the bimorph from contracting and extending during operation. The restriction reduces the free displacement of the device. Additionally the rigid clamp is problematic providing a repeatable clamping force which causes variance in the resonate frequency. An alternative mounting employed in the prior art is to provide a sliding surface for the bimorph mount which reduces actuator performance due to friction.

It is therefore desirable to provide a piezoelectric bimorph actuator having robust but flexible mounting allowing extension and contraction while isolating the bimorph from the mounting structure.

SUMMARY

Exemplary embodiments provide a piezoelectric bimorph actuator with an integral compliant boundary employing a first piezoelectric element, a second piezoelectric element and a composite layer intimately engaged between the first and second piezoelectric elements to form a bimorph actuator. The composite layer extends from a peripheral edge of the piezoelectric elements and has a curved interface portion providing a mount for attachment of the bimorph actuator.

A method of fabricating a piezoelectric bimorph actuator with an integral compliant boundary is disclosed for the embodiments wherein a piezoelectric disk is placed in the center of a depression in a female mold. A saturated piece of carbon fiber is then pressed on top of the piezoelectric disk urging the fiber against a filleted surface of the circumference of the depression in the mold to obtain a desired geometry of a curved section and creating an indent. An upper piezoelectric disk is placed in the indent on top of the saturated carbon fiber to form a bimorph actuator. The bimorph actuator is then cured.

BRIEF DESCRIPTION OF THE DRAWINGS

The features, functions, and advantages that have been discussed can be achieved independently in various embodiments of the present disclosure or may be combined in yet other embodiments, further details of which can be seen with reference to the following description and drawings.

FIG. 9D is a side section view demonstrating deflection of the bimorph actuator;

FIG. 11A is side section view of a valve implementing the bimorph actuator for actuation of a valve stem; and, FIG. 11B is a side section view of a valve implementing the bimorph actuator for actuation of a valve spool.

DETAILED DESCRIPTION

The system and methods described herein provide embodiments for a piezoelectric bimorph actuator with an integral compliant boundary. The flexible boundary is formed by incorporating a curved section in the periphery of the center layer of the bimorph extending from piezo electric elements such as piezoelectric disks. The curved section provides a mount which allows attachment of the bimorph while allowing the bimorph to extend and contract during operation. The curved mount is fabricated in a molding process by placing a center prepreg composite layer between two piezoelectric disks in a mold and curing with a hot press.

Figure 1:
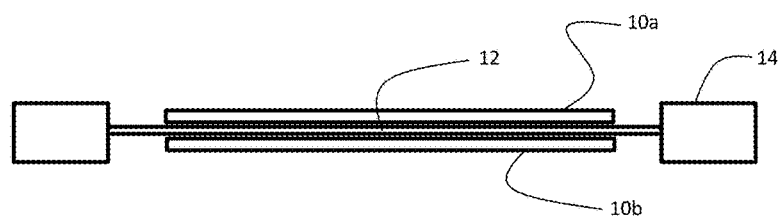
FIG. 1 is a schematic side section view of the mounting arrangement for a prior art bimorph actuator.

Referring to the drawings, FIG. 1 shows a schematic representation of a prior art bimorph actuator wherein piezoelectric elements, piezoelectric disks 10a and 10b for the exemplary embodiment, sandwich a center layer 12 typically fabricated from a composite sheet, which extends outwardly linearly by a distance R from the disks for attachment in clamping elements 14.

Figure 2:
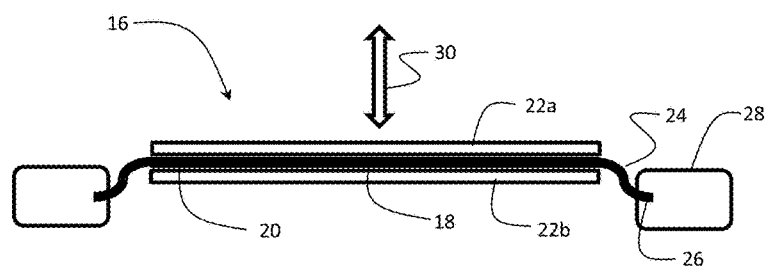
FIG. 2 is a schematic side section view of an exemplary embodiment of the disclosed piezoelectric bimorph actuator with integral compliant boundary.

As seen in FIG. 2, the present embodiments disclosed herein create an integral compliant boundary for the piezoelectric bimorph actuator 16 in a center composite layer 20, formed with carbon fiber with an epoxy resin matrix, by extending the center composite layer from a center section 18, which is intimately engaged between the cooperating disk shaped piezoelectric disks 22a and 22b, with a curved interface portion 24. The curved interface portion 24 terminates in a peripheral attachment portion 26 which may be secured in a clamping element 28. The clamping element 28 is typically ring shaped securing the peripheral attachment portion in a circular boundary. The geometry of the curved interface portion 24 provides flexibility allowing the bimorph actuator to extend and contract in the actuation direction represented by arrow 30.

Figure 3:
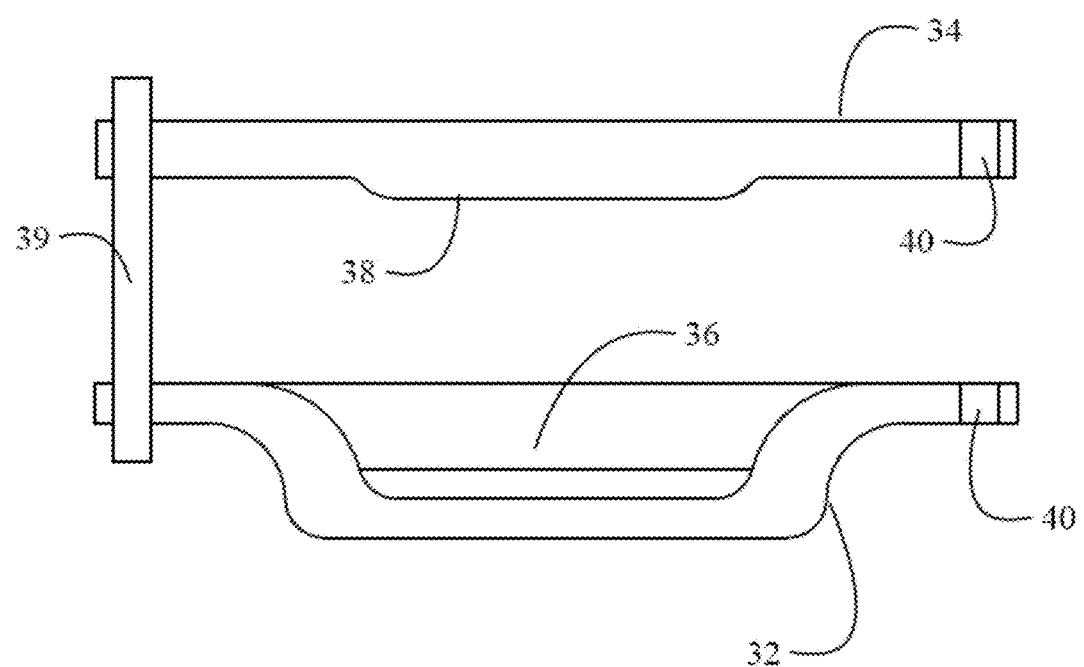
FIG. 3 is a side section view of an exemplary mold for fabrication of an embodiment of the piezoelectric bimorph actuator with integral compliant boundary.

Fabrication of the piezoelectric bimorph actuator with an integral compliant boundary is accomplished with a female mold 32 and mating male mold 34 as shown in FIG. 3. A depression 36 in the female mold 32 is sized to receive piezoelectric disks and a prepreg carbon fiber/epoxy center layer, as described subsequently. The depression 36 has a filleted outer circumference 37 (see FIGS. 4A-4E) to enhance the formation of the curved interface portion 24 of the center composite layer 20. The male mold 34 has a protrusion 38 to exert clamping force on the mold stack after buildup as will be described with regard to FIGS. 4A-4E. Alignment bores 40 are provided in the male and female molds to receive alignment rods 39 to enhance the clamping of the molds during processing.

Figure 4A:
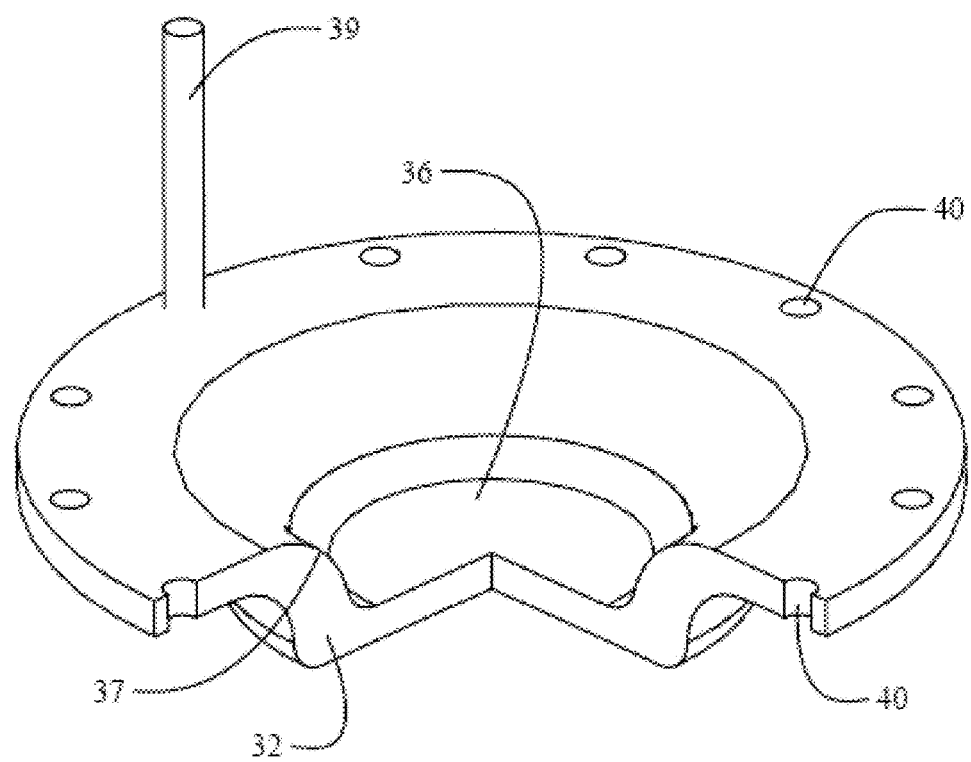
FIG. 4A is a quarter section isometric view of the female mold element.
Figure 4B:
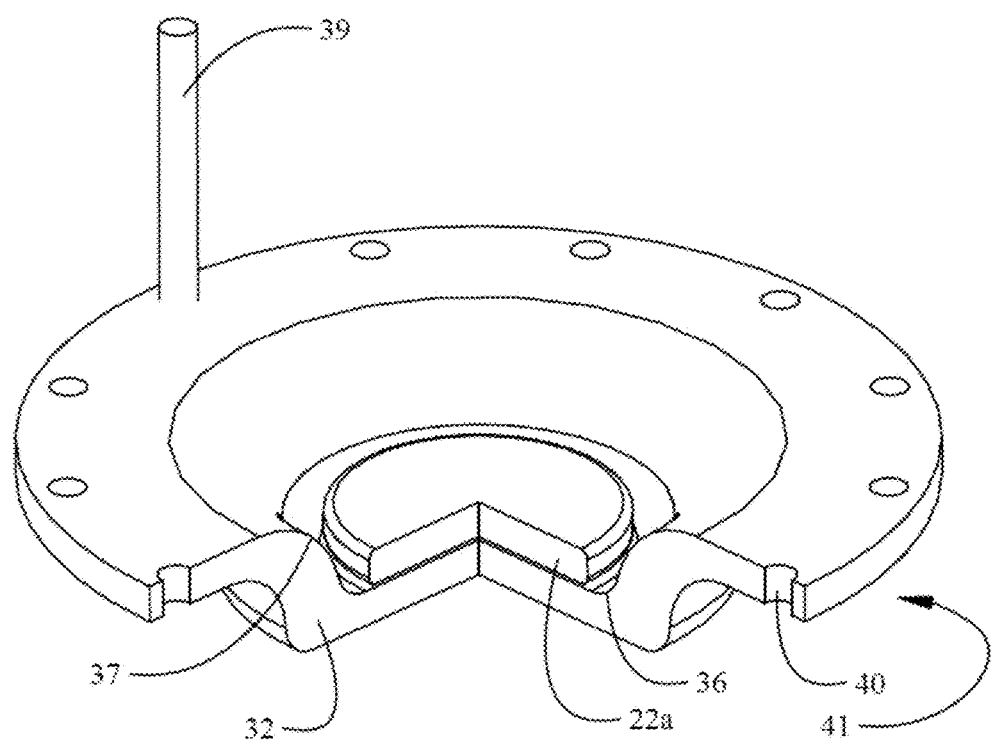
FIG. 4B is a quarter section isometric view of the female mold element with the lower piezoelectric disk inserted.
Figure 4C:
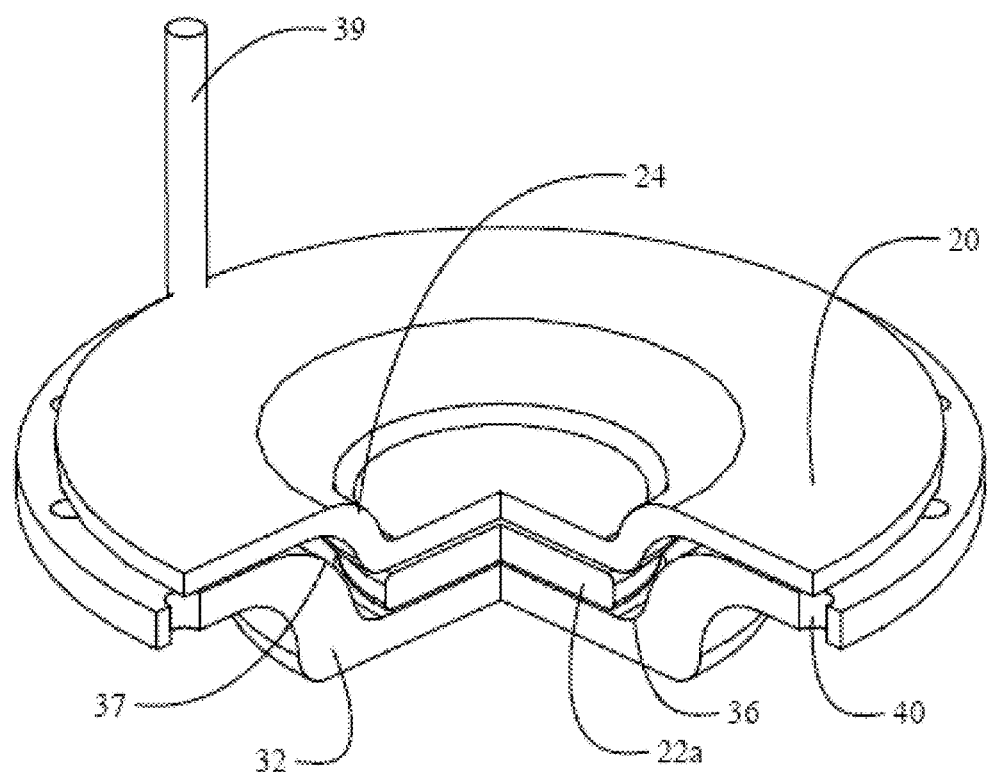
FIG. 4C is a quarter section isometric view of the female mold element with the carbon fiber support element inserted into the mold.
Figure 4D:
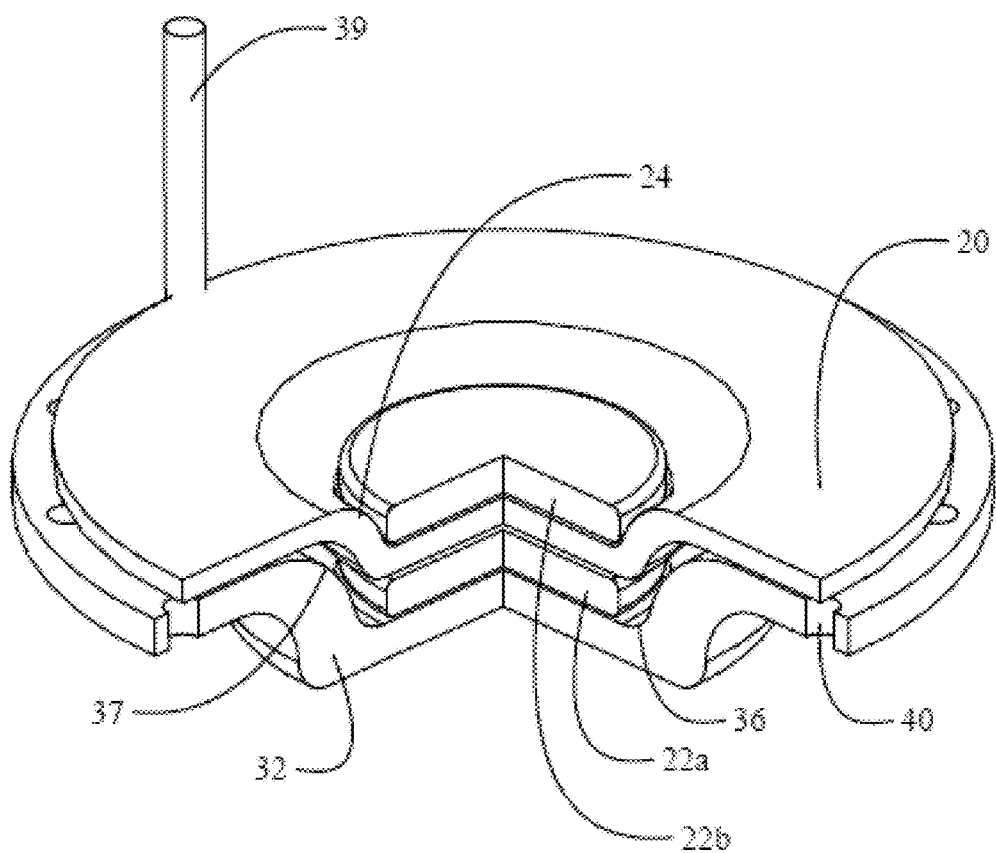
FIG. 4D is a quarter section isometric view of the female mold element with the upper piezoelectric disk inserted.
Figure 4E:
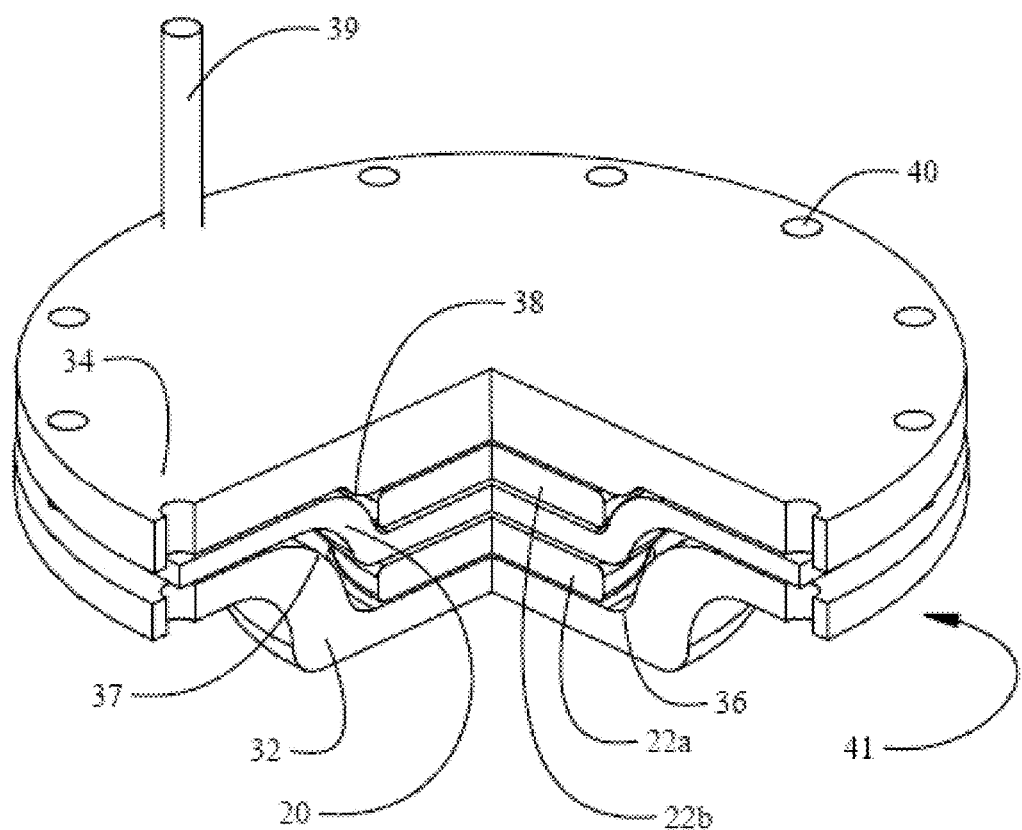
FIG. 4E is a quarter section isometric view of the completed mold stack.
Figure 4F:
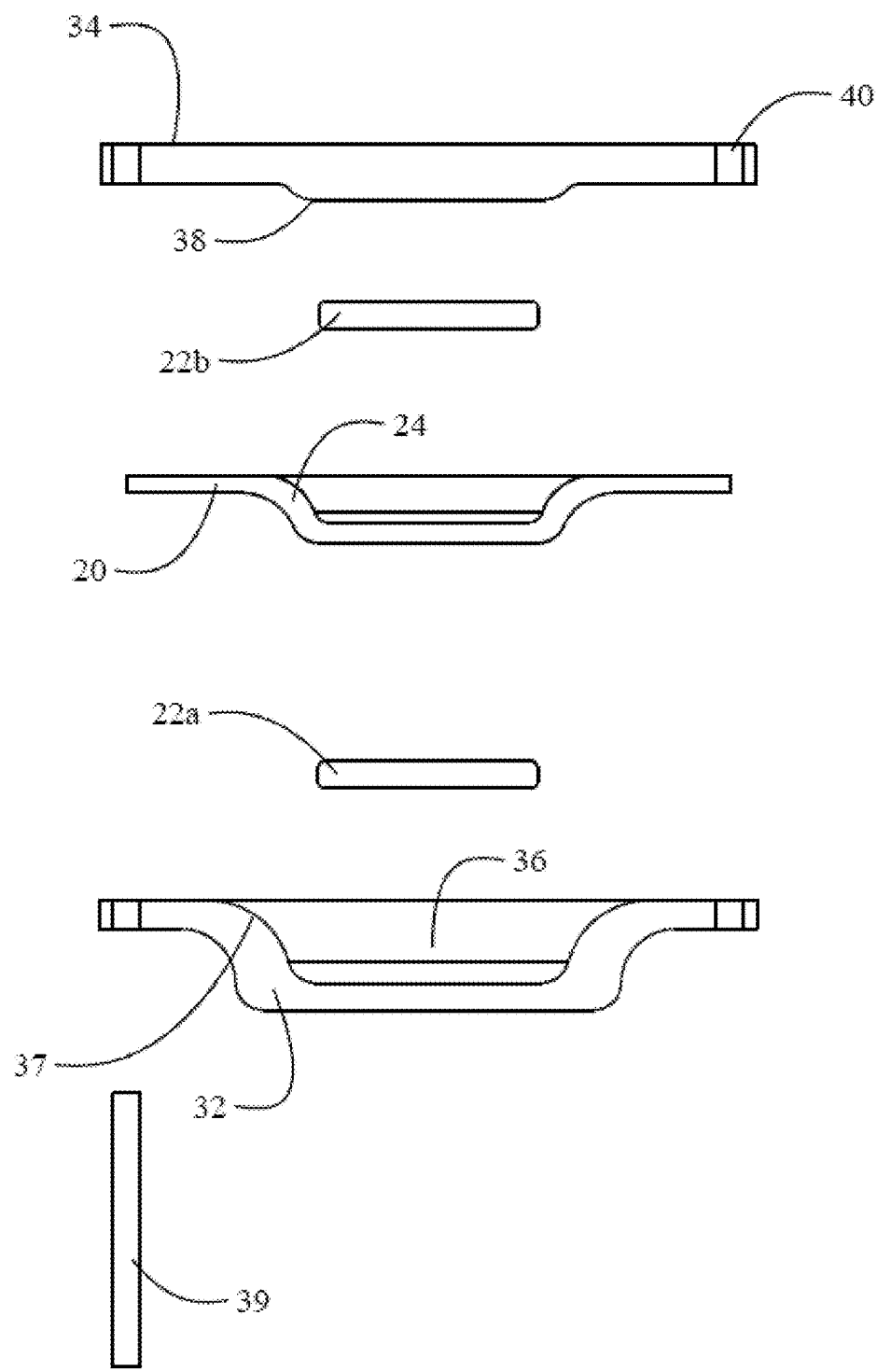
FIG. 4F is an exploded side section view of the elements of the mold stack.

The female mold 32 is provided as shown in FIG. 4A. As shown in FIG. 4B, the lower piezoelectric disk 22a is inserted in the depression 36 in the female mold 32. The composite center layer 20 is then inserted into the female mold 32 over the lower piezoelectric disk 22a and curved interface portion 24 is shaped over the filleted circumference of the depression 36 as seen in FIG. 4C. Spacing between the mold and molded elements in the stack and thicknesses of the elements is exaggerated in the drawings for clarity of the elements. For the exemplary embodiment, the composite center layer 20 is a prepreg created with carbon fiber fabric saturated with an epoxy resin. Hysol® epoxy resin available from Henkel AG & Co. is employed for the embodiment disclosed. The upper piezoelectric disk 22b is then inserted into the female mold 32 as shown in FIG. 4D and capped with the male mold 34 to complete the mold stack 41 as shown in FIGS. 4E and 4F.

Figure 5:
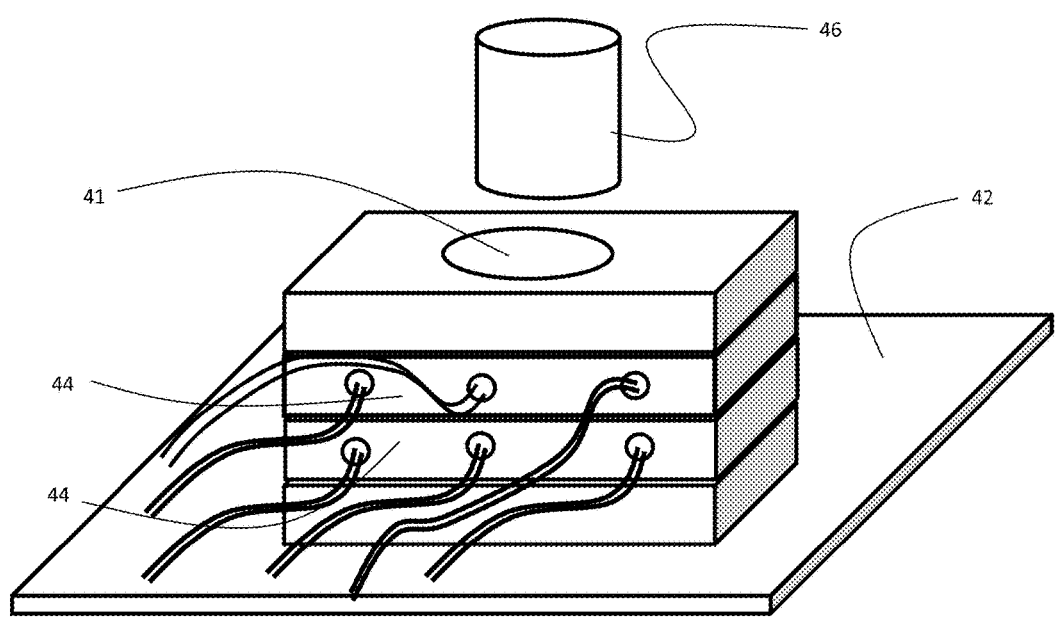
FIG. 5 is a schematic block diagram of an exemplary mold press and heating stack for mold processing of the piezoelectric bimorph actuator with integral compliant boundary.

The completed mold stack is then inserted into a press having a bottom plate 42 and a piston 46 as shown schematically in FIG. 5. Heater elements 44 provide heating for curing of the epoxy in the composite center layer 20 while the press a piston 46 exerts compression force on the mated mold stack 41.

Figure 6A:
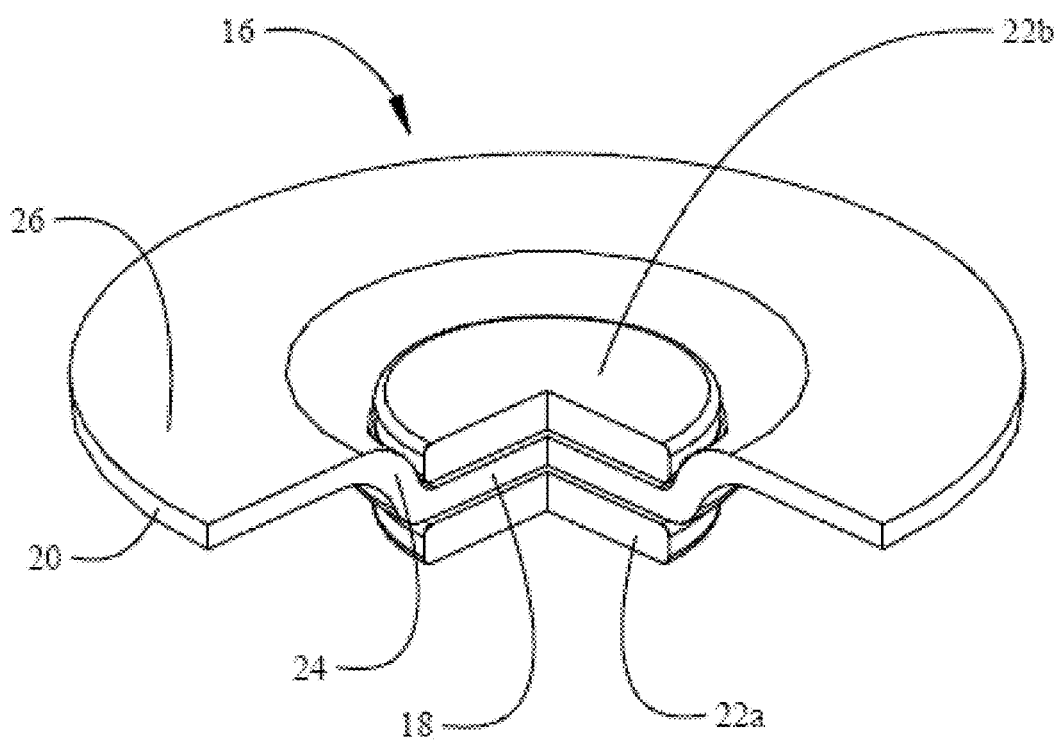
FIG. 6A is a is a quarter section isometric view of the molded piezoelectric bimorph actuator with integral compliant boundary.
Figure 6B:
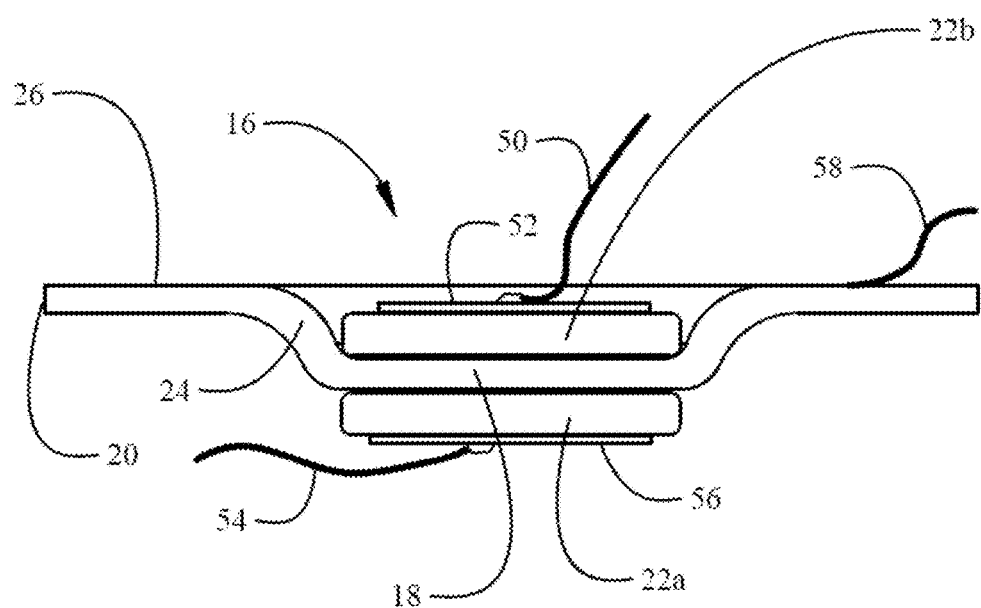
FIG. 6B is a side section view of the piezoelectric bimorph actuator of FIG. 6 with electrical leads attached.
Figure 7:
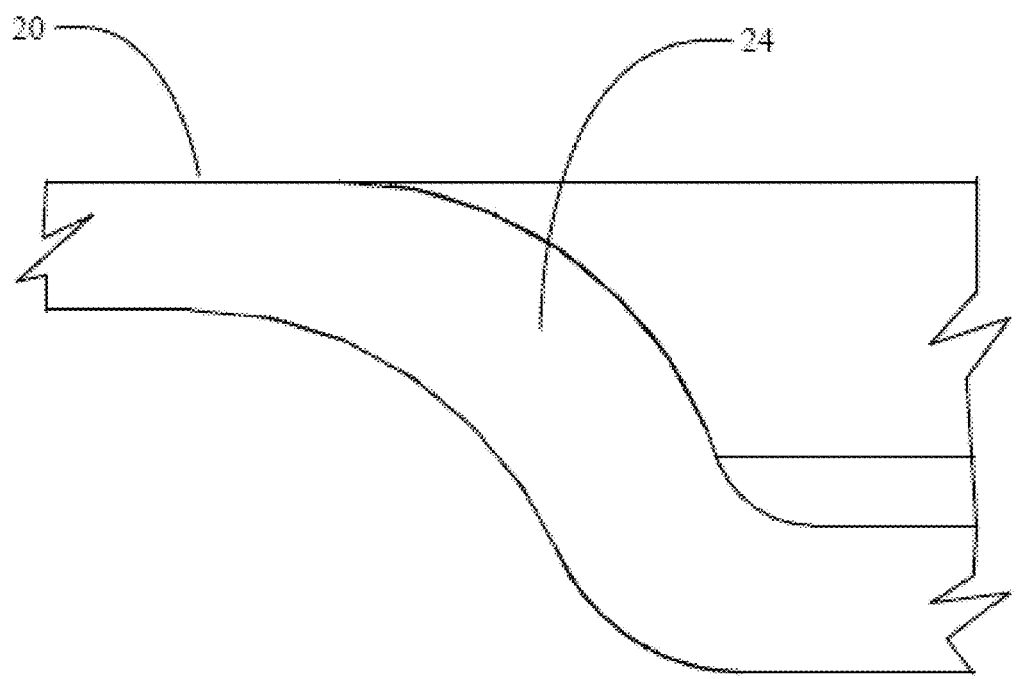
FIG. 7 is an exemplary geometric representation of the cross section shape of the curved portion of the carbon fiber support element.

The completed piezoelectric bimorph actuator with an integral compliant boundary is shown in FIGS. 6A and 6B. Center composite layer 20, extends from the center section 18 intimately secured between the cooperating disk shaped piezoelectric disks 22a and 22b and from a peripheral edge of the disks through the curved interface portion 24. The curved interface portion 24 having a flattened substantially S shaped profile shown in FIG. 7 terminates in a peripheral attachment portion 26 which may be secured in a clamping element. While shown in the embodiment as a substantially symmetrical S shape, a suitable double radius shape may be employed in various alternative embodiments. As seen in FIG. 6B, a first electrical lead 50 is connected to the upper piezoelectric disk 22b with a silver epoxy dollop applied to a carbon veil patch 52. A second electrical lead 54 is connected to the lower piezoelectric disk 22a with a silver epoxy dollop applied to a carbon veil patch 56. A ground lead 58 is attached to the center composite layer 20 with a silver epoxy dollop.

Figure 8A:
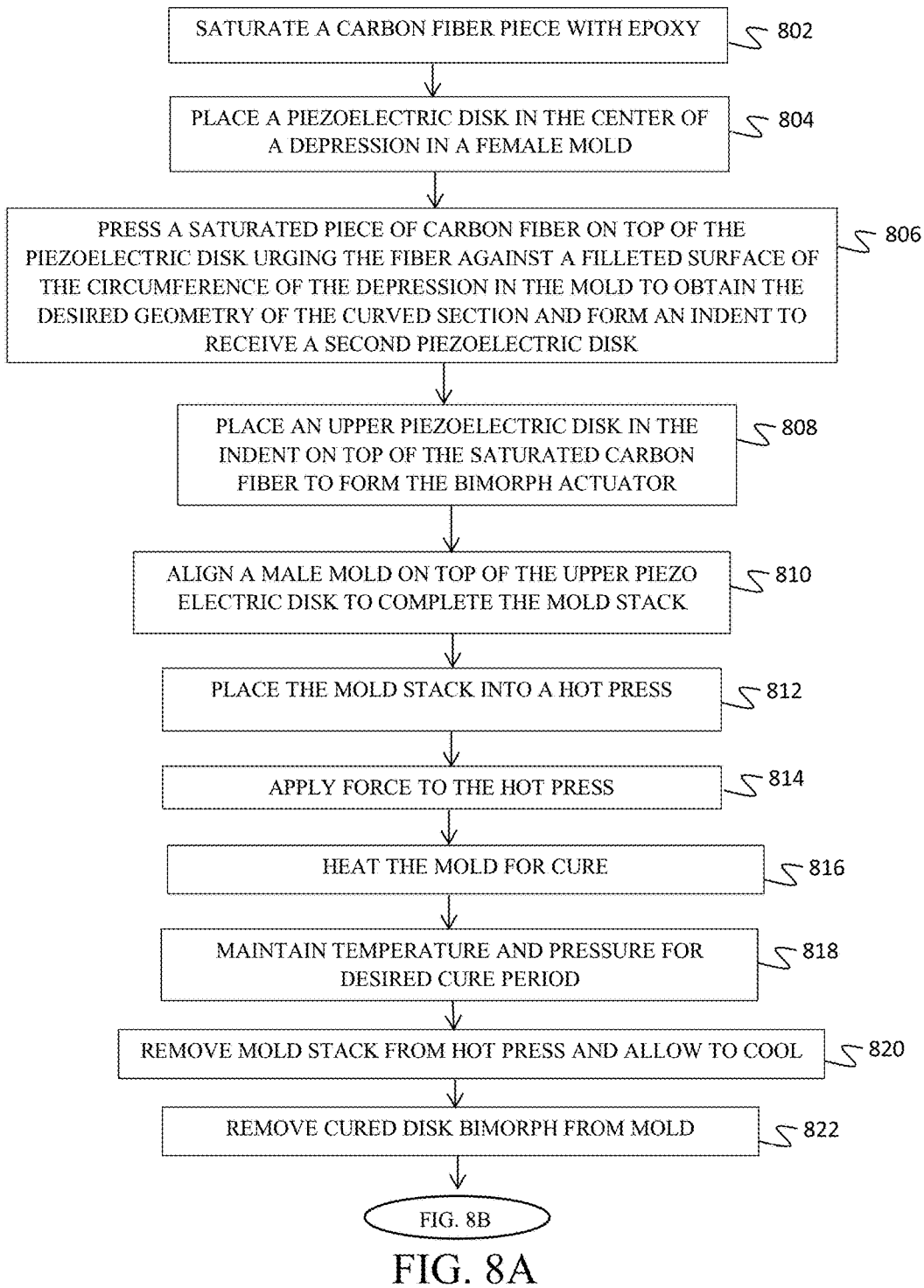
FIG. 8A-8C is a flow chart of a method for fabrication of the disclosed embodiments.
Figure 8B:
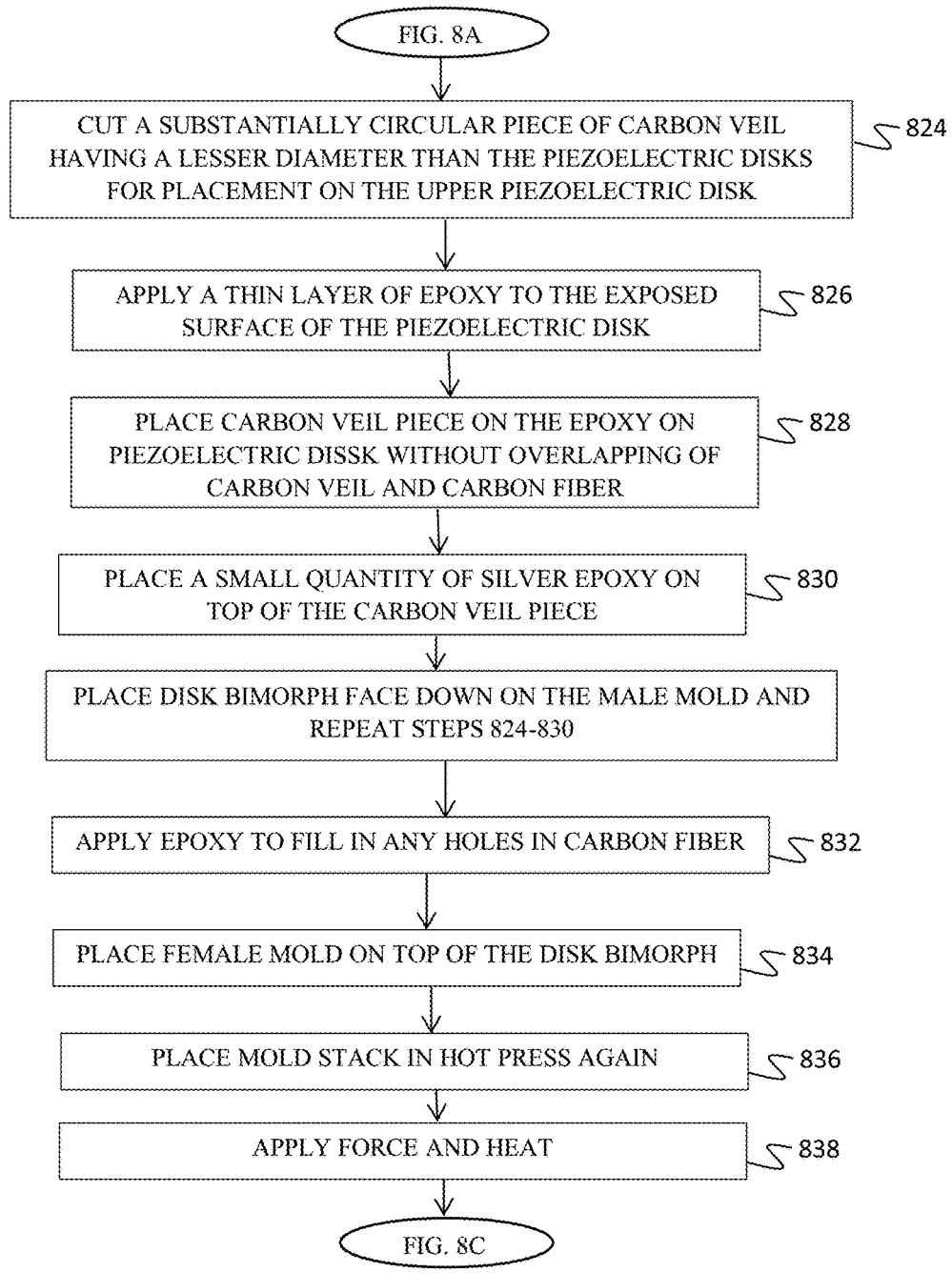
Figure 8C:
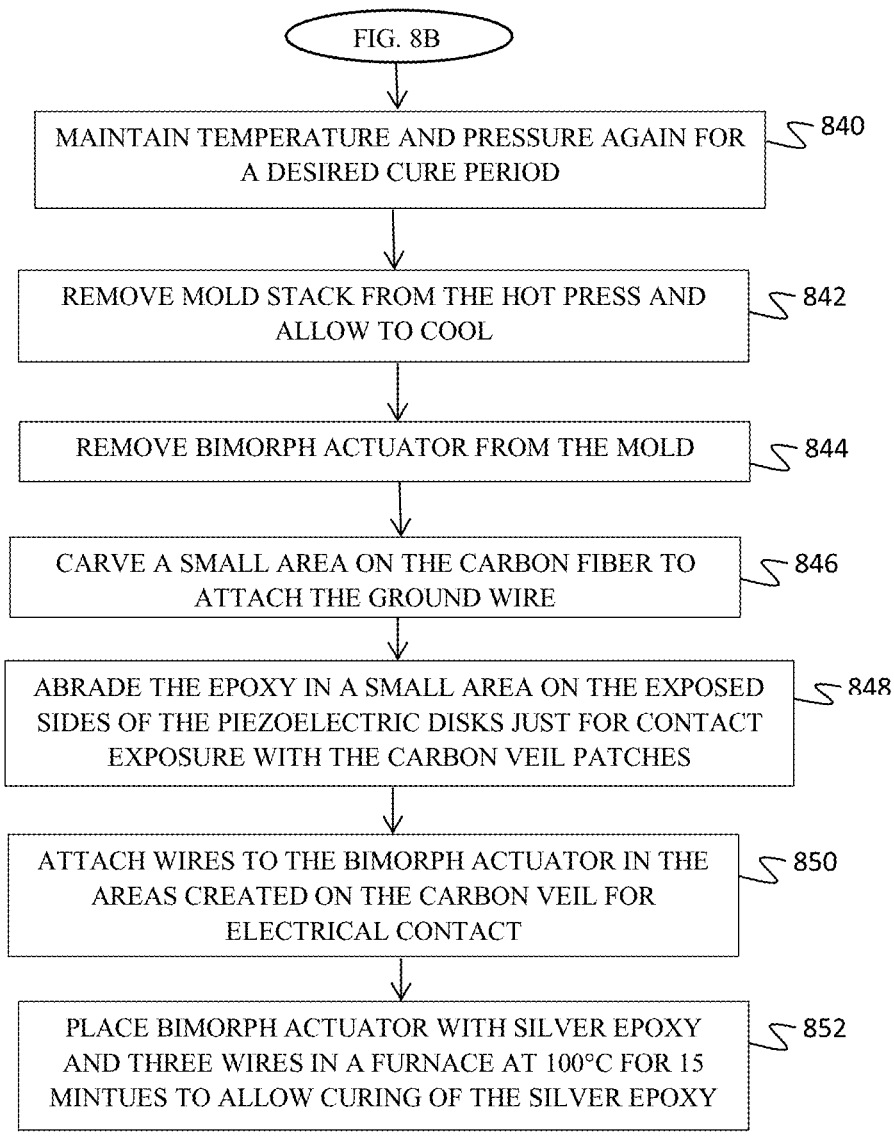

Fabrication details of the embodiment disclosed is described in the method shown in the flow chart of FIGS. 8A through 8C. A piece of carbon fiber is saturated with Hysol® epoxy, step 802. For the embodiment shown, a 3" diameter substantially circular patch is employed. Ultra Light Carbon Fiber Fabric, CF101, 2.0 oz, Plain Weave 13×13 Thread Count, 0.004" Thick, 1 k Tow, available from CST—The Composites Store, Inc., Tehachapi, Calif. is employed in the exemplary embodiment. Fabrics of this nature with a thickness of 0.003" to 0.005" would provide the desired physical properties for support of the piezoelectric discs. A piezoelectric disk is placed in the center of the depression in the female mold, step 804. A 1.25" Diameter, 0.0075" thickness disk is employed in the exemplary embodiment. The saturated piece of carbon fiber is pressed on top of the piezoelectric disk urging the fiber against the filleted surface of the circumference of the depression in the mold to obtain the desired geometry of the curved section and form an indent to receive the second piezoelectric disk, step 806. The upper piezoelectric disk is placed in the indent on top of the saturated carbon fiber to form the bimorph actuator, step 808. Both piezoelectric disks should have the same polarity. The male mold is aligned on top of the upper piezo electric disk to complete the mold stack, step 810. The mold stack is placed into a hot press, step 812, and force is applied to the hot press (approximately 100 lbs force for the example embodiment), step 814. The mold is heated for cure (approximately 100° C. for the example embodiment), step 816, and the temperature and pressure are maintained for the desired cure period (approximately one hour for the example embodiment), step 818. The mold stack is removed from hot press allow to cool, step 820. The cured disk bimorph is removed from the mold, step 822. A substantially circular piece of carbon veil having a lesser diameter than the piezoelectric disks is cut for placement on the upper piezoelectric disk (approximately 1" in diameter for the example embodiment), step 824, to conduct the high voltage throughout the piezoelectric material. Carbon Fiber Veil, 1064, 0.2 oz, 0.0021" thickness, available from Fibre Glast Developments Corporation, Brookville, Ohio is employed in the exemplary embodiment. A thin layer of epoxy is applied to the exposed surface of the piezoelectric disk, step 826, and the carbon veil piece is placed on the epoxy on piezoelectric disk without overlapping of carbon veil and carbon fiber, step 828. A small quantity (a few small droplets for the example embodiment) of silver epoxy is placed on top of carbon veil piece, step 830. The disk bimorph is placed face down on the male mold, and steps 824-830 are repeated for lower piezoelectric disc on the other side of bimorph. Epoxy is then applied to fill in any holes in carbon fiber, step 832, and the female mold is placed on top of the disk bimorph, step 834. The mold stack is again placed into hot press, step 836 and force and heat are applied, step 838. Temperature and pressure are again maintained for a desired cure period (one hour with 100 lbs force and 100° C. for the example embodiment), step 840. The mold stack is removed from the hot press and allowed to cool, step 842, and the bimorph actuator is then removed from mold, step 844. A small area is carved on the carbon fiber to attach the ground wire, step 846. The epoxy is abraded in a small area on the exposed sides of the piezoelectric disks just for contact exposure with the carbon veil patches, step 848. Wires are then attached to the bimorph actuator in the areas created on the carbon veil for electrical contact (32AWG wires are employed for the example embodiment), step 850. The bimorph actuator with silver epoxy and three wires is then placed in a furnace at 100° C. for 15 minutes to allow curing of the silver epoxy, step 852.

Figure 9A:
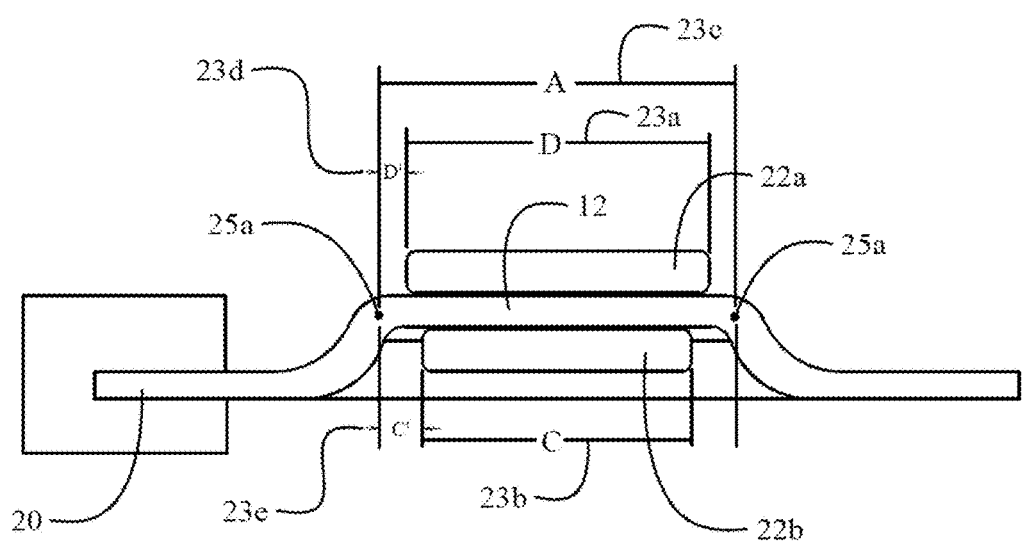
FIG. 9A is a side section view of an exemplary embodiment showing dimensional relationships of the elements.

In an exemplary embodiment, as described in FIG. 9A, the first piezoelectric disk 22a has a diameter D 23a and the second piezoelectric disk 22b has a diameter C 23b. The perimeter of the center portion 18 of the composite layer 20 is defined by a first inflection point 25a, the center portion having a length A 23c. The first piezoelectric disk 22a and second piezoelectric disk 22b are placed equidistant from the first inflection point 25a to form peripheral widths D' 23d and C' 23e respectively within length A 23c of the center portion 18 to form a bimorph actuator.

Figure 9B:
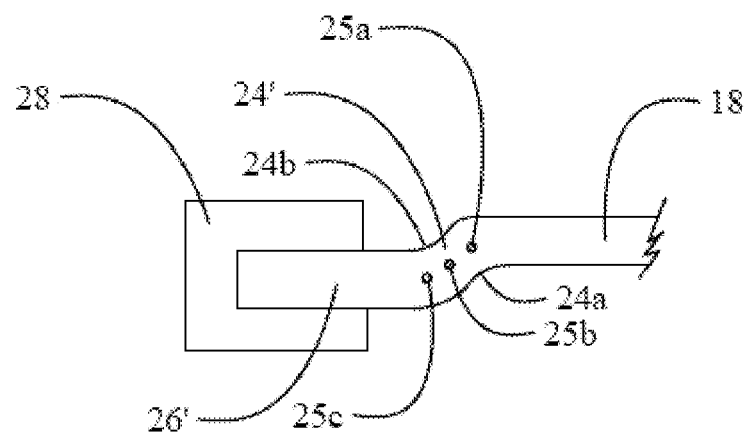
FIG. 9B is a detailed side section view demonstrating inflection points in the curved interface portion.
Figure 9C:
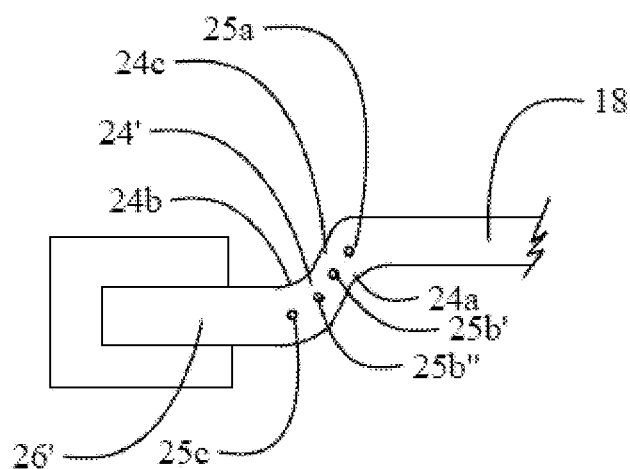
FIG. 9C is a detailed side section view demonstrating inflection points for an alternative shape in the curved interface portion.

In the same illustrative embodiment, as described in FIG. 9B, the curved interface portion 24 described above can be a stiffener portion 24' having a double radius as described above, with a convex curve 24a extending between inflection point 25a and least one second inflection point 25b, and a concave curve 24b between the at least one second inflection point 25b and a third inflection point 25c. The at least one second inflection point in stiffener portion 24' may include two inflection points 25b' and 25b" forming a convex curve 24a, a linear portion 24c, and a concave curve 24b as shown in FIG. 9C. For purposes of this disclosure, an inflection point is defined as a transition point between a convex portion and a concave portion, a convex portion and a flat portion, or a concave portion and a flat portion of a line.

In the same illustrative embodiment, as described in FIG. 9B, the peripheral attachment portion 26 described above can include a mounting portion 26'. The mounting portion 26' extends from the third inflection point 25c and as described above can be secured in a clamping element 28. As described above, the clamping element 28 can be ring shaped as described above, or the clamping can be achieved by fastening means, such as adhering using adhesives, fastening using suitable fasteners and any another suitable fastening means that substantially fixes the peripheral attachment portion 26 to a surface.

In one embodiment, the second piezoelectric disk 22b diameter C 23b is equal to length A 23c. In yet another embodiment, the second piezoelectric disk 22b diameter C 23b is less than length A 23c. The first piezoelectric disk 22a diameter D 23a may be equal to the second piezoelectric disk 22b diameter C 23b.

The placement of the second piezoelectric disks 22b peripheral width C' 23e is proportional to the vertical displacement E 23f achieved by the bimorph actuator during actuation as represented by arrow 30, illustrated in FIG. 9D. The vertical displacement E 23f is exaggerated for clarity. In addition, as described above, the stiffener portion 24' provides flexibility allowing the bimorph actuator to extend and contract in the actuation direction represented by arrow 30.

Figure 10A:
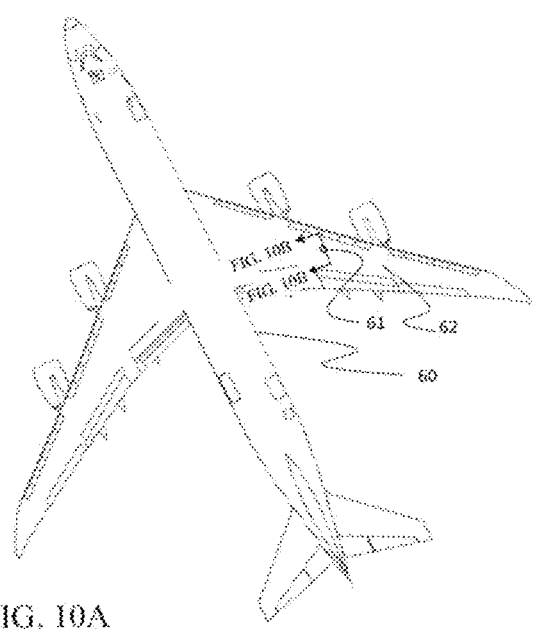
FIG. 10A is a pictorial view of an aircraft having a wing with an implementation of the bimorph actuator in a recessed pocket for active flow control.
Figure 10B:
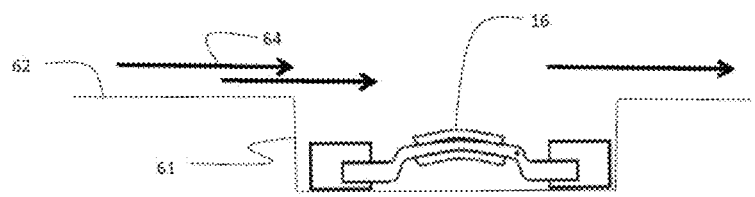
FIG. 10B is a detailed section view of the recessed pocket and bimorph actuator of FIG. 10A.

Turning now to FIGS. 10A-11B, illustrations are provided showing different implementations of the bimorph actuator described above. FIGS. 10A and 10B show an aircraft 60 with the bimorph actuator 16 described above, placed in a recessed pocket 61 of a wing 62 as an active flow control device, where air flow represented by arrows 64 travels above and over the pocket.

FIG. 11A, shows the bimorph actuator 16 placed in a valve 66 for actuation of a valve stem 68 for opening and closing against a valve seat 70. An alternative valve application for a spool valve 72 is shown in FIG. 11B wherein the bimorph actuator 16 drives the spool 74 to open and close fluid path 76.

Having now described various embodiments of the disclosure in detail as required by the patent statutes, those skilled in the art will recognize modifications and substitutions to the specific embodiments disclosed herein. Such modifications are within the scope and intent of the present disclosure as defined in the following claims.

What is claimed is:

1. A piezoelectric bimorph actuator with an integral compliant boundary comprising:
    a first piezoelectric element;
    a second piezoelectric element;
    a composite layer intimately engaged between said first and second piezoelectric elements to form a bimorph actuator, said composite layer extending from a peripheral edge of the piezoelectric elements and having a curved interface portion terminating in a peripheral attachment portion providing a mount for attachment of the bimorph actuator; and,
    a ring shaped clamping element securing the peripheral attachment portion in a circular boundary.

2. The piezoelectric bimorph actuator with an integral compliant boundary as defined in claim 1 wherein the first and second piezoelectric elements are first and second piezoelectric disks and the composite layer comprises a center section engaged between said first and second piezoelectric disks, a double radius curved interface portion extending from the center section and terminating in the peripheral attachment portion.

3. The piezoelectric bimorph actuator with an integral compliant boundary as defined in claim 2 wherein the double radius curved interface portion is substantially S shaped.

4. The piezoelectric bimorph actuator with an integral compliant boundary as defined in claim 1 wherein the composite layer comprises carbon fiber impregnated with an epoxy resin.

5. The piezoelectric bimorph actuator with an integral compliant boundary as defined in claim 4 wherein the carbon fiber comprises a plain weave carbon fabric 0.003 to 0.005 inches in thickness.

6. A piezoelectric bimorph actuator with an integral compliant boundary as defined in claim 1 wherein the first piezoelectric element comprises a first piezoelectric disk having a first diameter; the second piezoelectric elements comprises a second piezoelectric disk having a second diameter; and the composite layer has a first inflection point defining a perimeter of a center portion having a length A wherein the center portion of the composite layer is intimately engaged between the first and second piezoelectric disks to form the bimorph actuator and wherein the first and second piezoelectric disks are placed within the perimeter of the center portion length A and wherein the second diameter is less than or equal to length A.

7. A piezoelectric bimorph actuator with an integral compliant boundary as defined in claim 1 further comprising a valve stem adapted to engage one of the piezoelectric elements.

8. A piezoelectric bimorph actuator with an integral compliant boundary as defined in claim 1 further comprising a valve spool adapted to engage one of the piezoelectric elements.

9. The piezoelectric bimorph actuator with an integral compliant boundary as defined in claim 1, wherein the bimorph actuator is disposed in a recessed pocket on a wing of an aircraft to enable active flow control.

10. A piezoelectric bimorph actuator with an integral compliant boundary comprising:
    a first piezoelectric element;
    a second piezoelectric element;
    a composite layer intimately engaged between said first and second piezoelectric elements to form a bimorph actuator, said composite layer extending from a peripheral edge of the piezoelectric elements and having a curved interface providing a mount for attachment of the bimorph actuator; and,
    a first carbon veil patch adhered to the first piezoelectric element and a second carbon veil patch adhered to the second piezoelectric element each of said carbon veil patches receiving an electrical lead.

11. The piezoelectric bimorph actuator with an integral compliant boundary as defined in claim 10 wherein each electrical lead is secured to the associated carbon veil patch with a silver epoxy.

12. A method for fabrication of a piezoelectric bimorph actuator with an integral compliant boundary comprising:
    placing a piezoelectric disk as a first piezoelectric element in the center of a depression in a female mold;
    pressing a composite layer comprising a saturated piece of carbon fiber on top of the piezoelectric disk urging the fiber against a filleted surface of the circumference of the depression in the mold to obtain a desired geometry of a curved section and creating an indent;
    placing an upper piezoelectric disk as a second piezoelectric element in the indent on top of the saturated carbon fiber to form a bimorph actuator, said composite layer extending from a peripheral edge of the first and second piezoelectric elements and having a peripheral attachment extending from the curved section providing a mount for attachment of the bimorph actuator;
    curing the bimorph actuator; and
    securing a ring shaped clamping element on the peripheral attachment portion in a circular boundary.

13. The method for fabrication of a piezoelectric bimorph actuator with an integral compliant boundary as defined in claim 12 wherein the step of curing the bimorph actuator further comprises:
    aligning a male mold on top of the upper piezo electric disk to complete a mold stack;
    placing the mold stack into a hot press;
    heating the mold for cure.

14. The method for fabrication of a piezoelectric bimorph actuator with an integral compliant boundary as defined in claim 13 further comprising applying force to the hot press.

15. The method for fabrication of a piezoelectric bimorph actuator with an integral compliant boundary as defined in claim 14 further comprising:
    removing the mold stack from hot press and allowing the stack to cool;
    removing the cured disk bimorph from the mold.

16. The method for fabrication of a piezoelectric bimorph actuator with an integral compliant boundary as defined in claim 15 further comprising:
    cutting a substantially circular piece of carbon veil having a lesser diameter than the piezoelectric disks for placement on the upper piezoelectric disk;
    applying a thin layer of epoxy to an exposed surface of the upper piezoelectric disk;
    placing the carbon veil piece on the thin layer of epoxy without overlapping of carbon veil and carbon fiber;
    placing a small quantity of silver epoxy on top of carbon veil piece;
    placing the disk bimorph face down on the male mold;
    cutting a second substantially circular piece of carbon veil having a lesser diameter than the piezoelectric disks for placement on the lower piezoelectric disk;
    applying a second thin layer of epoxy to an exposed surface of the lower piezoelectric disk; and,
    placing the second substantially circular carbon veil piece on the second thin layer of epoxy without overlapping of carbon veil and carbon fiber.

17. The method for fabrication of a piezoelectric bimorph actuator with an integral compliant boundary as defined in claim 16 further comprising:
    applying epoxy to fill in any holes in carbon fiber;
    placing the female mold on top the disk bimorph reconstituting the mold stack;
    placing the mold stack into the hot press;
    applying force and heat to cure.

18. The method for fabrication of a piezoelectric bimorph actuator with an integral compliant boundary as defined in claim 17 further comprising:
    removing the mold stack from the hot press and allowing the mold stack to cool;
    removing the bimorph actuator from the mold;
    carving a small area on the carbon fiber to attach a ground wire;
    abrading the epoxy in a small area on exposed faces of the piezoelectric disks for contact exposure with the first and second carbon veil patches; and,
    attaching wire leads to the bimorph actuator in the abraded areas with silver epoxy for electrical contact.

19. The method for fabrication of a piezoelectric bimorph actuator with an integral compliant boundary as defined in claim 18 further comprising placing the bimorph actuator with silver epoxy and three wires in a furnace to allow curing of the silver epoxy.

* * * * *